United States Patent
Miller et al.

(10) Patent No.: US 6,825,117 B2
(45) Date of Patent: Nov. 30, 2004

(54) HIGH PH SLURRY FOR CHEMICAL MECHANICAL POLISHING OF COPPER

(75) Inventors: Anne E. Miller, Portland, OR (US); A. Daniel Feller, Portland, OR (US); Kenneth Cadien, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/461,158

(22) Filed: Dec. 14, 1999

(65) Prior Publication Data

US 2003/0134512 A1 Jul. 17, 2003

(51) Int. Cl.⁷ .................................. H01L 21/302
(52) U.S. Cl. ........................ 438/692; 438/693
(58) Field of Search .......................... 438/690–693

(56) References Cited

U.S. PATENT DOCUMENTS

| 5,340,370 | A | * | 8/1994 | Cadien et al. ............ 51/308 |
| 5,775,980 | A | * | 7/1998 | Sasaki et al. | |
| 6,001,730 | A | * | 12/1999 | Farkas et al. ............ 438/627 |
| 6,063,306 | A | * | 5/2000 | Kaufman et al. ......... 252/79.4 |
| 6,083,840 | A | * | 7/2000 | Mravic et al. ............ 438/693 |
| 6,221,775 | B1 | * | 4/2001 | Ference et al. ........... 438/691 |
| 6,274,478 | B1 | * | 8/2001 | Farkas et al. | |

* cited by examiner

*Primary Examiner*—Kin-Chan Chen
(74) *Attorney, Agent, or Firm*—Blakely, Sokoloff, Taylor & Zafman LLP

(57) ABSTRACT

A slurry for copper polishing has a pH between 7.5 and 12. In a particular embodiment of the present invention, a slurry for polishing copper has a pH between 8 and 11.5, and includes a $SiO_2$ abrasive, a $(NH_4)_2S_2O_8$ oxidizer, a benzotriazole corrosion inhibitor, and a $K_3PO_4/K_2HPO_4$ buffer. A copper polish slurry, in accordance with the present invention, operates with a high pH of greater than approximately 7.5. In this range the slurry has a low static etch due to formation of a robust, protective layer. This slurry may additionally have $S_2O_8^{-2}$ or $Fe(CN)_6^{-3}$ as an oxidizer and can thus offer a high polish rate on the order of 7,000 to 10,000 angstroms per minute which does not decrease significantly during polishing. Such an inventive slurry offers a wide CMP process window such that the slurry and process parameters can be optimized to yield low recess, erosion, and dishing on patterned wafers.

9 Claims, 5 Drawing Sheets

---

402
Provide high pH slurry to polishing pad

404
Bring copper damascene structure thereon into contact with polishing pad

406
Polish copper damascene structure

HIGH PH SLURRY FOR CHEMICAL MECHANICAL POLISHING OF COPPER

BACKGROUND OF THE INVENTION

1. Field of the Invention

The present invention relates to the field of chemical mechanical polishing (CMP), and more specifically, to slurries and methods for chemical-mechanical polishing of metal.

2. Background

Advances in semiconductor manufacturing technology have led to the development of integrated circuits having multiple levels of interconnect. In such an integrated circuit, patterned conductive material on one interconnect level is electrically insulated from patterned conductive material on another interconnect level by films of material such as, for example, silicon dioxide. These conductive materials are typically a metal or metal alloy. Connections between the conductive material at the various interconnect levels are made by forming openings in the insulating layers and providing an electrically conductive structure such that the patterned conductive material from different interconnect levels are brought into electrical contact with each other. These electrically conductive structures are often referred to as contacts or vias.

Other advances in semiconductor manufacturing technology have lead to the integration of millions of transistors, each capable of switching at high speed. A consequence of incorporating so many fast switching transistors into an integrated circuit is an increase in power consumption during operation. One technique for increasing speed while reducing power consumption is to replace the traditional aluminum and aluminum alloy interconnects found on integrated circuits with a metal such as copper, which offers lower electrical resistance. Those skilled in the electrical arts will appreciate that by reducing resistance, electrical signals may propagate more quickly through the interconnect pathways on an integrated circuit. Furthermore, because the resistance of copper is significantly less than that of aluminum, the cross-sectional area of a copper interconnect line, as compared to an aluminum interconnect line, may be made smaller without incurring increased signal propagation delays based on the resistance of the interconnect. Additionally, because the capacitance between two electrical nodes is a function of the overlap area between those nodes, using a smaller copper interconnect line results in a decrease in parasitic capacitance. In this way, replacing aluminum based interconnects with copper based interconnects provides, depending on the dimensions chosen, reduced resistance, reduced capacitance, or both.

As noted above, copper has electrical advantages, such as lower resistance per cross-sectional area, the ability to provide for reduced parasitic capacitance, and greater immunity to electromigration. For all these reasons, manufacturers of integrated circuits find it desirable to include copper in their products.

While advantageous electrically, copper is difficult to integrate into the process of making integrated circuits. As is known in this field, copper can adversely affect the performance of metal oxide semiconductor (MOS) field effect transistors (FETs) if the copper is allowed to migrate, or diffuse, into the transistor areas of an integrated circuit. Therefore copper diffusion barriers must be used to isolate copper metal from those transistor areas. Additionally, unlike aluminum based metal interconnect systems which are formed by subtractive etch processes, copper interconnects are typically formed by damascene metal processes. Such processes are also sometimes referred to as inlaid metal processes. In a damascene process, trenches are formed in a first layer, and a metal layer is formed over the first layer including the trenches. Excess metal is then polished off leaving individual interconnect lines in the trenches. The removal of the excess copper is typically accomplished by chemical mechanical polishing (CMP). Although there are many known variations of the damascene method of metallization, the most common method for removing the excess copper metal is by CMP.

Accordingly, there is a need for CMP methods, materials, and apparatus to polish conductive materials such as copper.

SUMMARY OF THE INVENTION

Briefly, a slurry for copper polishing has a pH between 7.5 an 12.

In a particular embodiment of the present invention, a slurry for polishing copper has a pH between 8 and 11.5, and includes a $SiO_2$ abrasive, an $(NH_4)_2S_2O_8$ oxidizer, a benzotriazole corrosion inhibitor, and a $K_3PO_4/K_2HPO_4$ buffer.

DETAILED DESCRIPTION

A method and slurry for the chemical-mechanical polishing of copper are described. In the following description numerous specific details are set forth to provide an understanding of the present invention. It will be apparent, however, to those skilled in the art and having the benefit of this disclosure, that the present invention may be practiced with apparatus and processes that vary from those specified here.

Terminology

The terms, chip, integrated circuit, monolithic device, semiconductor device or component, microelectronic device or component, and similar terms and expressions, are often used interchangeably in this field. The present invention is applicable to all the above as they are generally understood in the field.

The terms metal line, trace, wire, conductor, signal path and signaling medium are all related. The related terms listed above, are generally interchangeable, and appear in order from specific to general. In this field, metal lines are sometimes referred to as traces, wires, lines, interconnects or simply metal.

The terms contact and via, both refer to structures for electrical connection of conductors from different interconnect levels. These terms are sometimes used in the art to describe both an opening in an insulator in which the structure will be completed, and the completed structure itself. For purposes of this disclosure contact and via refer to the completed structure.

Design rules, as used herein, refers to a set of rules that define the width, spacing, and layer-to-layer relationships of the various elements that make up an integrated circuit. By way of example and not limitation, the minimum width of, and spacing between, interconnect lines on a particular interconnect level of an integrated circuit are specified in the design rules for any specific semiconductor manufacturing process.

Erosion, as used herein, refers to the amount of a layer, typically an interlayer dielectric, that is removed during the polishing of a metal damascene structure. Erosion is measured as a thickness, or distance, and more particularly, it is a measure of the distance between the original surface of the layer and its post-polish surface. Erosion is generally an undesirable result of overpolishing. The pre-polished thickness is shown as $T_{ILD0}$ in FIG. 1.

Figure 2:
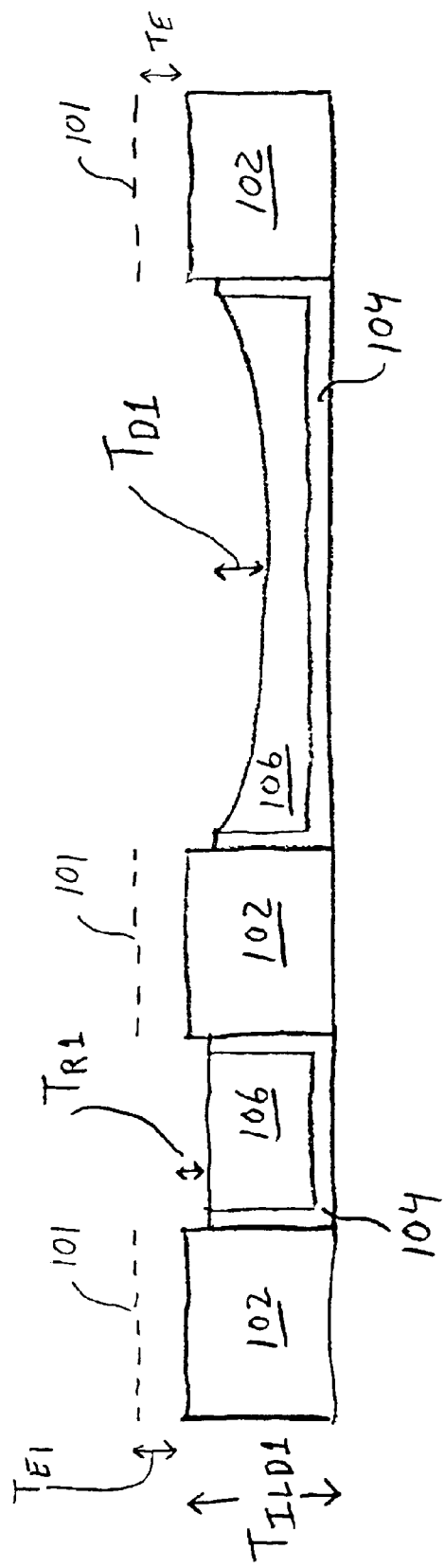
FIG. 2 is a schematic cross-sectional view of the copper damascene structure of FIG. 1 after a conventional chemical mechanical polishing operation.
Figure 3:
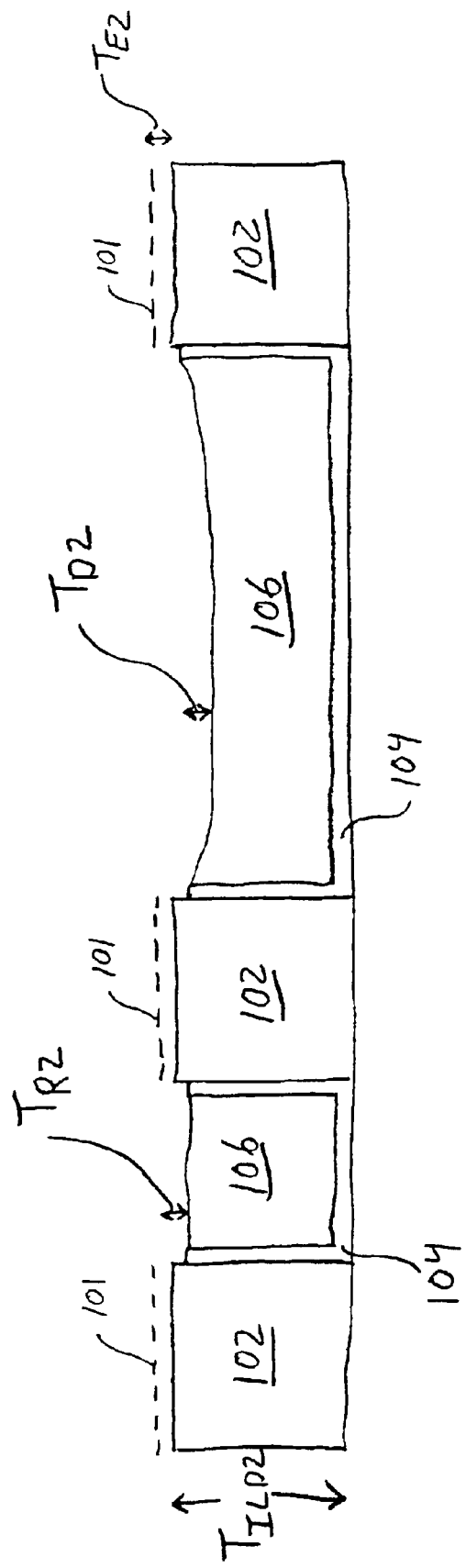
FIG. 3 is a schematic cross-sectional view of the copper damascene structure of FIG. 1 after a chemical mechanical polishing operation in accordance with the present invention.

Examples of post-polish thickness can be seen in FIGS. 2 and 3 and are identified as $T_{ILD1}$ and $T_{ILD2}$. Erosion is defined as the total oxide loss represented by the differences, $T_{ILD0}-T_{ILD1}$ and $T_{ILD0}-T_{ILD2}$. Typically, the erosion, or interlayer dielectric loss, is enhanced for structures such as serpentines, where the copper density is high relative to the dielectric density.

Recess, as used herein, refers to an amount of material, typically the metal of a metal damascene structure, that is removed during the polishing of the metal damascene structure. Recess is measured as a thickness, or distance, and more particularly, it is a measure of the distance between the post-polish surface of the interlayer dielectric and the post-polish surface of the metal. The recess is typically due to chemical attack rather than mechanical abrasion and is the main metal loss component of narrow, isolated metal lines. The spatial profile of a copper line due to recessing is typical flat. Examples of recess can be seen in FIGS. 2 and 3 and are identified as $T_{R1}$ and $T_{R2}$.

Dishing, as used herein, refers to an amount of material, typically the metal of a metal damascene structure, that is removed during the polishing of the metal damascene structure. Dishing is similar to recess in that it represents an overpolishing of the metal (i.e., excess material removal), however dishing typically results in a parabolic or concave shaped metal surface and is due to a mechanical interaction as the polish pad bends into the damascene structure. Dishing is measured as a thickness, or distance, and more particularly, it is a measure of the distance between the post-polish surface of the interlayer dielectric and the post-polish surface of the metal. Dishing typically occurs in metal structures that are wider than the minimum metal width permitted in a given set of design rules. Examples of dishing can be seen in FIGS. 2 and 3 and are labelled as $T_{D1}$ and $T_{D2}$.

The expression, low dielectric constant material, refers to a material having a lower dielectric constant than silicon dioxide.

Substrate, as used herein, refers to the physical object that is to be planarized by means of the CMP process. A substrate may also be referred to as a wafer. Wafers, may be made of semiconducting, non-semiconducting, or combinations of semiconducting and non-semiconducting materials. Silicon wafers may have thin films of various materials formed upon them. These thin films may be planarized with CMP processing. Other substrate materials such as GaAs, silicon-on-sapphire, or silicon on insulator (SOI) may be planarized with CMP processing.

The term vertical, as used herein, means substantially perpendicular to the surface of a substrate.

RPM (also rpm) refers to revolutions per minute.

Overview

Figure 5:
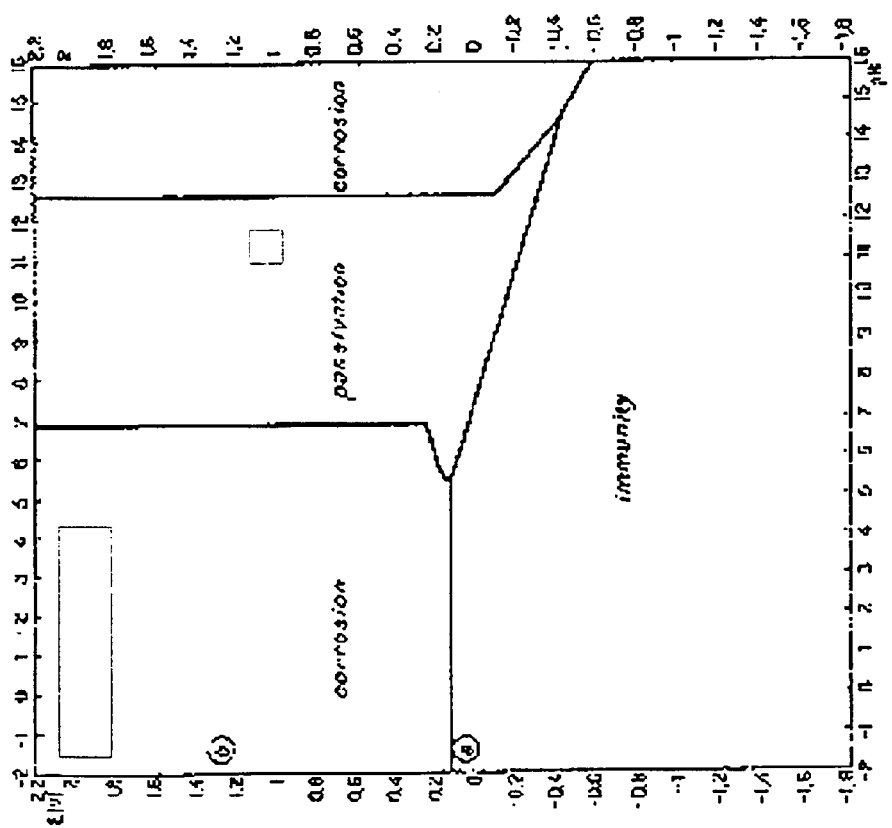
FIG. 5 is a Pourbaix diagram showing the domains of corrosion, immunity, and passivation of copper, at 25° C. (after M. Pourbaix, Atlas of Electrochemical Equilibria in Aqueous Solutions, National Association of Corrosion Engineers, 1974, pg. 389).

Polishing of copper metal layers in connection with the formation of conductive interconnect lines for integrated circuits is becoming more important for the semiconductor industry. Unlike aluminum metallization, which is typically formed on integrated circuits by subtractive metal etch, copper interconnect lines are typically formed by way of a damascene, or inlaid, metal process. Such a process requires the removal, typically by chemical mechanical polishing (CMP), of the excess copper. CMP has been used successfully for polishing interlayer dielectrics such as silicon dioxide. CMP has also been used to polish metals such as tungsten, particularly in the formation of contact plugs. However, copper is unlike either silicon dioxide or tungsten. Copper is a soft metal compared to tungsten which makes CMP more difficult to achieve. As predicated by thermodynamics, both copper and tungsten slurries can be tailored for operation in the passivating pH regime of the Pourbaix diagram. FIG. 5 shows the Pourbaix diagram for copper. In support of this theory, the bulk dissolution rate or static etch rate of slurries approach zero at pH>6. However, in practice, the copper film that forms may be reactive with ionic species such as $SO_4^-$ or $Cl^-$, and thus, benefits from the addition of a corrosion inhibitor such as benzotriazole. Erosion, dishing, and recessing are difficulties encountered in the CMP of copper because of the chemical and physical properties of copper.

Conventional methods of copper polishing for integrated circuit manufacturing include using an alumina-based, or silica-based, slurry at a pH equal to or less than 7.5. CMP of copper with conventional copper polish slurries frequently results in high corrosion rates. Furthermore, when conventional copper polish slurries are modified to include a corrosion inhibitor, the result is a narrow process window in terms of concentrations, pressures, and pad conditions, all of which limit the robustness, and in turn the cost effectiveness, of the copper polish process.

Furthermore, use of many of the conventional slurries, having an abrasive concentrations in the range of approximately 4% to 5%, results in the occurrence of glazing during the polishing of a wafer. Glazing refers to a condition wherein grooves, or other non-planarities, in the surface of a polishing pad fill up with particles or other material common to conventional copper polishing processes. Glazing reduces the ability of the polish pad to accomplish the desired material removal function. This phenomenon is sometimes referred to as shut-down. This can result in a requirement for longer polish times, or interim conditioning on CMP tools which do not include in-situ pad conditioning.

A copper polish slurry, in accordance with the present invention, operates with a high pH of greater than approximately 7.5. In this range the slurry has a low static etch due to formation of a robust, protective layer. This slurry may additionally have $S_2O_8^{-2}$ or $Fe(CN)_6^{-3}$ as an oxidizer and can thus offer a high polish rate on the order of 7,000 to 10,000 angstroms per minute. This polishing rate does not decrease significantly during polishing. Such an inventive slurry offers a wide CMP process window such that the slurry and process parameters can be optimized to yield low recess, erosion, and dishing on patterned wafers.

Various embodiments of the present invention offer a number of advantages over previous methods and slurries.

Embodiments of the present invention offer negligible static etch rates. With the addition of a corrosion inhibitor in this pH regime, a stable, robust, passivating layer is formed on the copper, thereby providing a wide CMP process window in terms of concentrations, pad conditions, and polish pressures. Embodiments of the present invention provide an abrasive that substantially reduces or eliminates glazing, or shut down, during polish. Further embodiments of the present invention provide an abrasive that promotes high polish rates, and therefore high wafer throughput. Additionally, due to the substantial absence of glazing, a strong, robust, mechanical endpoint signature at polish pressures below 3 pounds per square inch (psi) is obtained. Because the polish rates enabled by embodiments of the present invention are substantially insensitive to pressure reduction, and can be operated effectively at polish pressures below 3 psi, erosion and dishing are both reduced. Furthermore, erosion can be tailored by reducing the $SiO_2$ concentration to below approximately 5% without inducing a significant reduction in polish rate. In a further aspect of the present invention, a buffer system that improves uniformity and reduces defects is provided.

The Slurry

An exemplary slurry, in accordance with the present invention, for chemical mechanical polishing of copper, has a pH between 8 and 11, and includes a $SiO_2$ abrasive, an $(NH_4)_2S_2O_8$ oxidizer, a benzotriazole corrosion inhibitor, and a $K_3PO_4/K_2HPO_4$ buffer.

An abrasive suitable for use in the embodiments of the present invention is a precipitated $SiO_2$. This precipitated $SiO_2$ is preferred over a fumed, or gas phase, $SiO_2$. Precipitated $SiO_2$ is sometimes referred to in this industry as colloidal, although this term, i.e., colloidal, is not a technically accurate designation for this material.

In addition to $(NH_4)_2S_2O_8$, chemicals such as $K_2S_2O_8$, or $K_3Fe(CN)_6$ may be used as oxidizers.

Corrosion inhibitors which may be used as an alternative to benzotriazole include other forms of benzotriazole such as 5-methyl benzotriazole or 1-methyl benzotriazole.

In addition to the benzotriazole inhibitors, additional corrosion inhibitors containing $Ba^{2+}$ or $Ca^{2+}$ may be added to suppress the pitting corrosion that occurs in the presence of $S_2O_8^{2-}$. The addition of these cations getters $SO_4^-$ species that otherwise attack the passive Cu-benzotriazole layer by forming an insoluble precipitate of either $BaSO_4$ or $CaSO_4$.

Buffer systems which may be used as an alternative $K_3PO_4/K_2HPO_4$ include $KH_2PO_4/KOH$, $K_2HPO_4/KOH$, and $KHCO_3/K_2CO_3$ In one embodiment of the present invention, a slurry includes 5 wt. % precipitated $SiO_2$ as an abrasive, 0.05M $(NH_4)_2S_2O_8$ as an oxidizer, 0.005M benzotriazole as a corrosion inhibitor, and 0.175g/l $K_3PO_4$ and 0.046g/l $K_2HPO_4$ as a buffer system. Alternative embodiments may include $SiO_2$ in the range of 2 to 10 wt. %.

Those skilled in the art and having the benefit of this disclosure will further recognize that it is not necessary to use a corrosion inhibitor, such as benzotriazole as part of the inventive slurry. Rather, this example is provided simply to illustrate the present invention. Those skilled in the art will further appreciate that a slurry formulated in accordance with the present invention will also include some reaction products of the various ingredients.

Method

Figure 1:
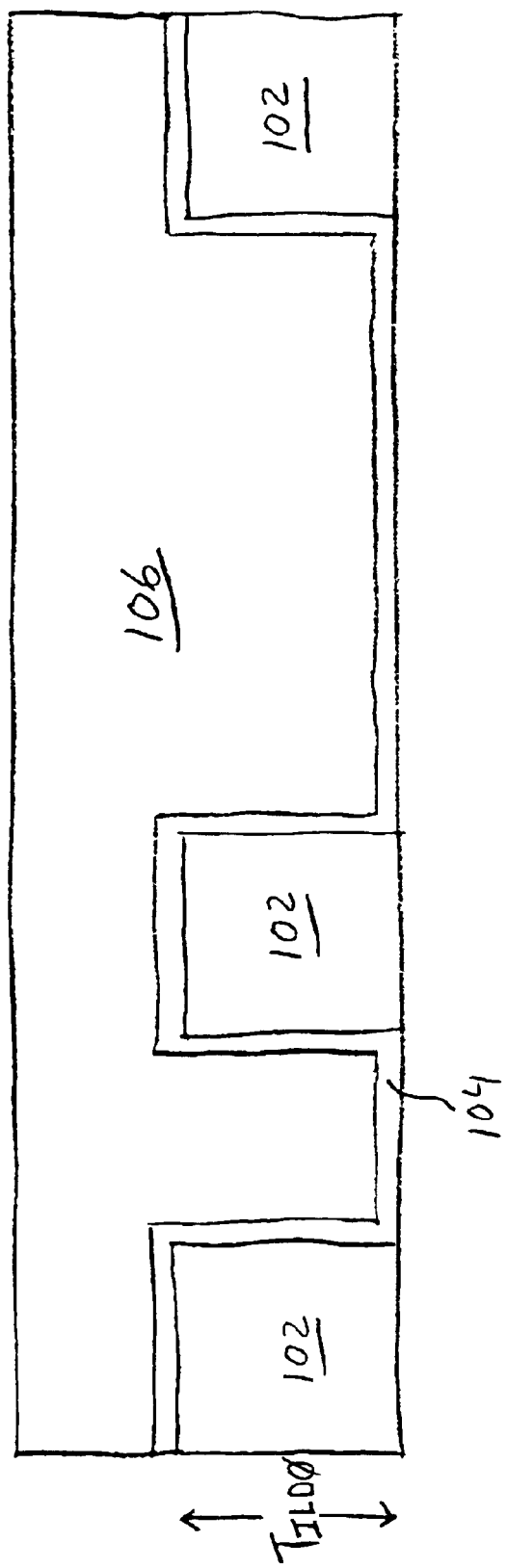
FIG. 1 is a schematic cross-sectional view of a copper damascene structure. This structure represents a post-plating, pre-polishing state of fabrication.

In an embodiment of the present invention, a copper damascene structure is polished to form individual interconnects. FIG. 1 shows a copper damascene structure. An interlayer dielectric layer (ILD) is patterned to form ILD 102 on a surface of a wafer as illustrated in the figure. ILD 102 has a thickness represented by $T_{ILD0}$ in FIG. 1. A copper diffusion barrier 104 is formed over the exposed surfaces of the wafer and ILD 102. Various materials may be used as the copper diffusion barrier. Tantalum and tantalum nitride are often proposed as advantageous copper diffusion barriers. Typically a copper seed layer is then formed on copper diffusion barrier 104. A complete copper layer 106 is then formed, typically by plating, over diffusion barrier 104.

FIG. 2 illustrates the results of conventional copper CMP. More particularly, erosion, recess, and dishing are all illustrated in the figure. The post-polish thickness of ILD 102 is shown as $T_{ILD1}$. The difference between $T_{ILD0}$ and $T_{ILD1}$ is called erosion. The erosion, (i.e., $T_{ILD0}-T_{ILD1}$) is typically measured in the center of a dense array such as a serpentine and is typically much greater than the erosion measured in a large open field. Recess, represented by $T_{R1}$, affects the thickness of the post-polish copper 106, and is measured from the top surface of the post-polish ILD 102 to the top surface of post-polish copper 106 as shown. Wide metal lines are particularly susceptible to a phenomenon known as dishing. Dishing, represented by $T_{D1}$, shows the additional material removed from wide metal lines.

FIG. 3 illustrates the results of copper CMP in accordance with embodiments of the present invention. Erosion, recess, and dishing are all illustrated in FIG. 3, but it can be seen that these exist to a lesser extent here than in FIG. 2. The post-polish thickness of ILD 102 in FIG. 3 is shown as $T_{ILD2}$. In FIG. 3 recess is represented by $T_{R2}$, and dishing is represented by $T_{D2}$. It can be seen that copper CMP in accordance with the present invention produces a smaller erosion $T_{ILD2}$, recess $T_{R2}$, and dishing $T_{D2}$. This results in achieving the desired cross-sectional areas for copper interconnect. Table 1, below, shows the results obtained when polishing with a high pH slurry compared to a conventional slurry.

TABLE 1

| Slurry | Conventional Slurry | High pH Slurry | High pH Slurry |
|---|---|---|---|
| pH | 7.1 | 8.5 | 8.5 |
| Pressure (psi) | 3.75 | 3.75 | 2 |
| Erosion (nm): 90% Copper Density | 573 | 334 | 193 |
| Dishing (nm): 100 μm line | 221 | 87 | 45 |
| Recess (nm): 1 μm line | 41 | 3 | 0.5 |

Figure 4:
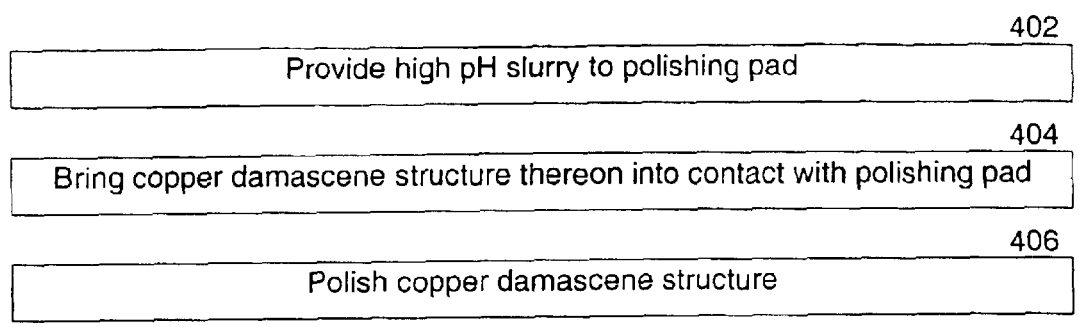
FIG. 4 is a flowchart showing the operations in a process of polishing a thin film in accordance with the present invention.

An embodiment of the method of polishing a thin film on a wafer, in accordance with the present invention, is described in conjunction with FIG. 4.

As is well known, in a typical CMP system, a wafer is placed face down on a rotating table covered with a polishing pad, which has been coated with a slurry. A carrier, which may be attached to a rotatable shaft, is used to apply a downward force against the backside of the wafer. A retaining ring may be used to center the wafer onto the carrier and to prevent the wafer from slipping laterally. By applying the downward force, and rotating the wafer, while simultaneously rotating a slurry covered pad, a desired amount of material may be removed from the upper surface of a thin film on the surface of the wafer.

FIG. 4 shows a flow diagram of a process embodying the present invention. At block 402, a high pH slurry is prepared, delivered to, and dispensed onto, a polishing pad. The high pH slurry, as described above, is typically in the range of 7.5 to 12, and may be in the range of 8 to 11. Then, as shown at block 404, a wafer with a copper damascene structure formed thereon, is brought into contact with the polishing pad. As shown at block 406 the copper damascene structure is polished. Typical polishing conditions using an orbital polisher are a down force of approximately 3.75 psi, an orbital speed of approximately 310 rpm, a wafer rotational speed of approximately 10 rpm, a slurry flow rate of 200 ccm, and delta P of −0.1 psi. Delta P is the pressure difference exerted on the top and bottom of the wafer and allows fine control of the rate at the edge of the wafer. Stacked polishing pads such as the IC1000, with a Suba-4 sub-pad, both made by Rodel, Inc. of Newark, Del., can be used with the high pH slurry to polish copper films. FX-9 pads from Freudenberg of Lowell, Mass., can be also used. Removal rates of approximately 8505 angstroms per minute have been obtained with within wafer non-uniformity (1 sigma) of 6.5%.

Copper diffusion barriers, such as, for example, tantalum or tantalum nitride, are also successfully polished with slurries and polishing conditions in accordance with the present invention.

Methods and slurries in accordance with the present invention may be used with various interlayer dielectric materials. For example, even though $SiO_2$ has traditionally been the dielectric material used between interconnect levels on integrated circuits, various low-k dielectric materials, including but not limited to, SiOF may also be used with embodiments of the present invention.

The motor current endpoint signal obtained with embodiments of the present invention are stronger than those found with conventional copper CMP processes. This improved mechanical endpoint correlates with the absence of glazing.

Conclusion

Embodiments of the present invention provide high pH slurries for chemical mechanical polishing of copper films.

An advantage of some embodiments of the present invention is that the polish time can be reduced thus reducing manufacturing cost.

A further advantage of some embodiments of the present invention is that dishing is reduced.

A still further advantage of some embodiments of the present invention is that erosion is reduced.

A still further advantage of some embodiments of the present invention is that the polish end point signal is improved as compared to that obtained in conventional methods.

It will be apparent to those skilled in the art that a number of variations or modifications may be made to the illustrative embodiments described above. For example, various combinations, slurry pH, slurry delivery rate, pad rotation speed, pad temperature, and so on, may be used within the scope of the present invention.

Other modifications from the specifically described apparatus, slurry, and process will be apparent to those skilled in the art and having the benefit of this disclosure. Accordingly, it is intended that all such modifications and alterations be considered as within the spirit and scope of the invention as defined by the subjoined claims.

What is claimed is:

1. A method of forming copper interconnect, comprising:
   forming a dielectric layer over a substrate, the dielectric layer having trenches therein;
   forming a copper diffusion barrier at least in the trenches;
   depositing copper over the copper diffusion barrier and over a top surface of the dielectric layer; and
   polishing the copper with a high pH slurry comprising 2–10 wt % silica, an oxidizer comprising $(NH_4)_2S_2O_8$, a corrosion inhibitor comprising $Ba_{2+}$, and a pH between 8–11.5.

2. The method of claim 1, wherein the dielectric layer comprises an oxide of silicon, and the copper diffusion barrier is electrically conductive.

3. The method of claim 1, wherein the dielectric layer comprises a fluorinated oxide of silicon, and the copper diffusion barrier is selected from the group consisting of tantalum, and tantalum nitride.

4. The method of claim 1, wherein polishing comprises chemical mechanical polishing with a down force of less than or equal to approximately 3.75 psi.

5. The method of claim 1, wherein polishing comprises:
   engaging the copper with a polishing pad with a down force less than or equal to 3.75 psi; and
   providing a slurry flow rate of approximately 200 ccm.

6. The method of claim 5, wherein polishing further comprises an orbital speed of approximately 310 rpm and a wafer rotational speed of approximately 10 rpm.

7. A method of polishing a copper film, comprising:
   polishing the copper film with a slurry comprising 2–10 wt % silica, an oxidizer comprising $(NH_4)_2S_2O_8$, a corrosion inhibitor comprising $Ca^{2+}$ and a pH between 8–11.5.

8. The method of claim 7, wherein polishing comprises:
   engaging the copper with a polishing pad with a down force less than or equal to 3.75 psi; and
   providing a slurry flow rate of approximately 200 ccm.

9. The method of claim 8, wherein polishing further comprises an orbital speed of approximately 310 rpm and a wafer rotational speed of approximately 10 rpm.

* * * * *

UNITED STATES PATENT AND TRADEMARK OFFICE
CERTIFICATE OF CORRECTION

PATENT NO. : 6,825,117 B2
DATED : November 30, 2004
INVENTOR(S) : Miller et al.

It is certified that error appears in the above-identified patent and that said Letters Patent is hereby corrected as shown below:

Column 8,
Line 18, delete "$Ba_{2+}$" and insert -- $Ba^{2+}$ --.

Signed and Sealed this

Twenty-fourth Day of May, 2005

JON W. DUDAS
*Director of the United States Patent and Trademark Office*